April 24, 1962 T. G. CUSTIN ETAL 3,031,623
VISUAL RECEIVER LIMITER CIRCUIT
Filed Nov. 20, 1957

INVENTORS:
THOMAS G. CUSTIN,
JACK SMITH,
BY Joseph P. Kates
THEIR ATTORNEY.

United States Patent Office 3,031,623
Patented Apr. 24, 1962

3,031,623
VISUAL RECEIVER LIMITER CIRCUIT

Thomas G. Custin, Baldwinsville, and Jack Smith, North Syracuse, N.Y., assignors to General Electric Company, a corporation of New York Filed Nov. 20, 1957, Ser. No. 697,676
5 Claims. (Cl. 328—171)

Figure 1:
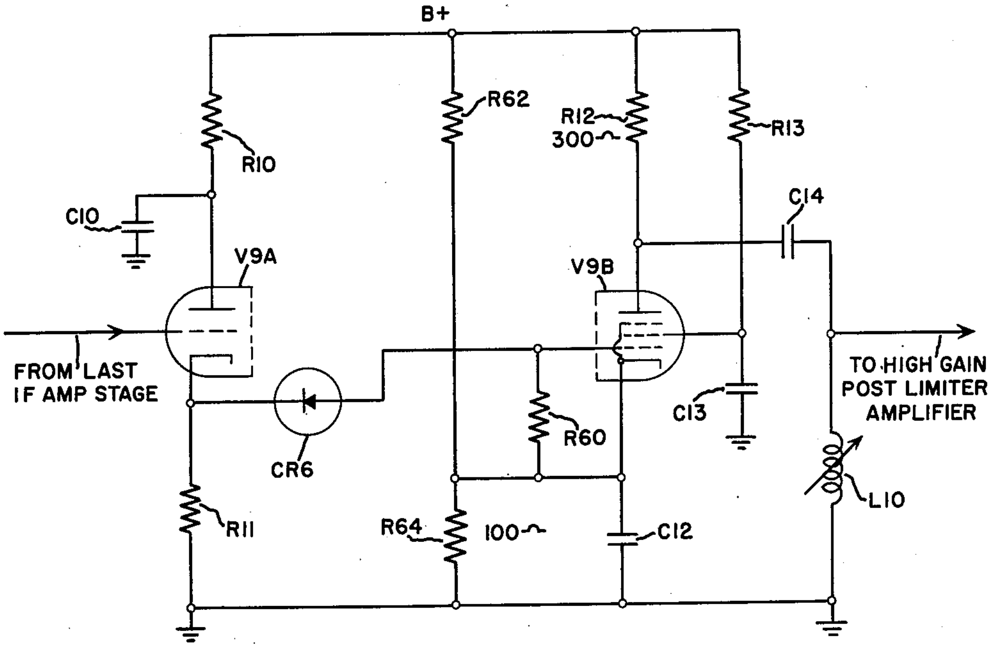

The present invention relates to a limiter circuit and limiting method and more particularly relates to a limiter circuit and method especially adaptable for limiting the signal in a visual receiver in television microwave equipment. A good limiter for this purpose must clip the intermediate frequency (IF) signals and also remove amplitude modulation especially at low frequencies.

Wide band limiter circuits used in the past have generally been of two types. The first employs a pair of diodes arranged to clip the signal. If the diodes are to work over a wide band width a very low value of load resistance, commensurate with the diode's stray capacitance is required. Since the diodes are of finite impedance in the forward conducting direction the low load resistance results in large attenuation. In addition, diode stray capacitance acts as a voltage divider so that a portion of the voltage is coupled around due to the characteristics of the diode and in this way the limiter ceases to limit on very large signals. Other types of prior art limiter circuits utilize a pentode and may be arranged so that they develop grid leak bias. The grid leak bias prevents the grid of the limiter from going positive and this in turn is intended to limit the negative excursion of the plate. The cut-off characteristic of the tube limits the negative swing on the grid. One disadvantage of this arrangement is that it provides symmetrical clipping only at one level of input voltage. Above this level the limiter clips only the top portion of the input voltage. This generally results in the undesirable characteristic that as the signal increases, the output decreases due to the unsymmetrical characteristic of the top of the sine wave. This also results in passing more noise. If the signal is increased still further, the stray capacitance between the input and the output of the limiter serves to couple the input around the limiter so that eventually with increasing signal strength the limiter ceases to function. An example of another prior art device is shown in Patent No. 2,739,191 to T.C. Wisenbacker et al. for Clipping Amplifiers, issued March 20, 1956.

Our application discloses broadly a separate bias for a rectifier in the grid circuit of a tube, however there is no two-level limiter comparable with the present invention. The limiter circuit of the present invention overcomes the aforementioned and other deficiencies of prior art devices and methods, and in addition clips the input signal frequency and also removes undesired amplitude modulation, eliminates use of tuned circuits and provides good limiting of low frequency amplitude variations, provides circuitry to present a symmetrical clipped output and overcomes the deficiency of large signals coupling across the elements of the tubes due to stray capacities across the tube elements. In addition, the limiter of the present invention is designed to accommodate a wide range of input signals and still present a constant output.

Accordingly an object of the present invention is to provide a limiting circuit especially suitable for microwave equipment for limiting the signal in a television receiver.

Another aim of the present invention is to provide a limiter suitable for clipping IF signal frequency and simultaneously removing amplitude modulation especially at low frequencies.

Another purpose of the present invention is to provide a limiter capable of providing limiting on very large signals.

Another object of the invention is to provide a limiter capable of symmetrical clipping at various levels of input voltage with constant level output with varying signal level input.

Another purpose of the present invention is to provide a limiter circuit capable of giving a symmetrical clipped output with a wide variation of levels of input and wherein limiting of low frequency amplitude variations will be performed satisfactorily.

Another object of the present invention is to present a limiter circuit which will accommodate a wide range of input signals and still present a constant output and which will have relatively few components and avoid the use of relatively expensive tuned circuits.

Figure 2:
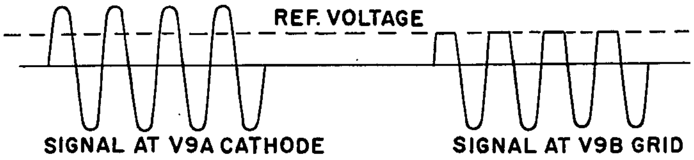
Figure 3:
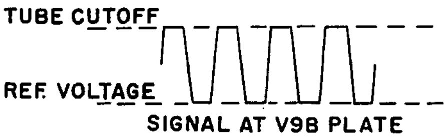

Other objects and many of the attendant advantages of this invention will be readily appreciated as the same becomes better understood by reference to the following detailed description when considered in connection with the accompanying drawings wherein:

FIG. 1 presents a schematic representation of one preferred illustrative embodiment of the limiter circuit of the present invention;

FIG. 2 is a diagram showing in relation to a reference voltage, the signal at the cathode of the first stage of the circuit of FIG. 1 and the signal at the grid of the second stage of the circuit of FIG. 1; and FIG. 3 is a representation of the output waveform at the plate of the second stage of the limiter of FIG. 1.

Referring now to the drawings and more particularly referring to the schematic representation of FIG. 1, the illustrative embodiment of the limiter circuit of the present invention may present a first cathode follower stage V9A which may, for example, be ½ of a 6AU8 tube. Stage V9A may have a plate or anode, a control grid or control electrode and a cathode. Connected between the B+ supply or source and the plate of cathode follower V9A may be a plate resistor R10, which provides for voltage drop to present the correct voltage at the plate of stage V9A. Resistor R10 may be a 22 ohm resistor. A decoupling capacitor C10 which may be of the order of 1000 μμf (micromicrofarads) may be disposed between the plate of cathode follower V9A and ground. Connected between the cathode of cathode follower V9A and ground may be a cathode load resistor R11 which may be an 820 ohm resistor. To the control grid of the cathode follower V9A may be applied an intermediate frequency signal from the last intermediate frequency amplifier stage. Connected between the B+ voltage supply and ground may be a voltage divider comprising resistors R62 and R64. Resistor R62 may be of the order of 11,000 ohms and resistor R64 may be of the order of 100 ohms in the embodiment shown in FIG. 1. A second stage V9B may be a pentode, for example, ½ of a 6AU8 tube having a plate, a suppresser grid, a screen grid, a control grid, and a cathode and disposed between the plate of stage V9B and the B+ supply may be an output load resistor R12. For a purpose to be hereinafter described resistor R12 may be a relatively small resistance of the order of 300 ohms. Connected between the cathode of the cathode follower V9A and the control grid of pentode V9B may be a crystal diode CR6. Crystal diode CR6 may be a IN90 germanium type crystal, for example. Connected between the cathode of pentode V9B and ground and across voltage divider resistor R64 may be a bypass capacitor C12, which may be a .01 μf capacitor. Crystal diode CR6 may have its cathode electrically tied to the cathode of triode V9A and may have its plate tied to the control grid of pentode V9B for a purpose to be described. A load resistor R60 for the crystal diode CR6 may be connected between the control grid of pentode V9B and the cathode of V9B. Resistor R60 may be of the order of 510 ohms. A resistor R13 may be connected between the B+ supply and the screen grid of pentode V9B to provide appropriate screen voltage in accordance with the operating characteristics of pentode V9B or as one alternative the screen grid of pentode V9B could be tied to the plate of triode V9A to provide proper screen voltage and decoupling. A decoupling capacitor C13 may be connected between the screen grid of pentode V9B and ground to decouple the screen voltage. A coupling capacitor C14 which may be of the order of 100 $\mu\mu$f. may be disposed between the plate of pentode V9B and the following high gain post limiter amplifier (not shown). Disposed in the grid circuit of the post limiter amplifier may be an adjustable tuning inductor L10, from the grid of this stage to ground.

Operation of the circuit of FIG. 1 may be described as follows:

The cathode follower V9A presents a high linear impedance to the IF source and provides a D.-C. driving impedance for the limiter. This D.-C. coupling provides for better low frequency limiting. The voltage divider comprising resistors R62 and R64 sets a small positive reference voltage at the anode of the crystal diode CR6. It also provides a D.-C. reference voltage for the cathode of pentode V9B, with respect to the control grid of that stage. Capacitor C12 is a bypass for resistor R64 which gives a constant D.-C. bias voltage and provides a bypass for IF to ground. Crystal diode CR6 is so poled that it presents a low impedance to signal passage as long as the signal voltage on resistance R11 is less positive than the D.-C. reference voltage on resistance R64, but when it become more positive than this reference voltage crystal diode CR6 presents a high impedance and the signal does not pass as shown by the flat top portions of the curve illustrated at the right in FIG. 2. That is, the cathode of diode CR6 is connected to the cathode of tube V9A and the anode of CR6 is connected to input grid electrode of amplifier 9VB.

On the positive swing of the signal applied from the last IF amplifier stage to the control grid of the cathode follower V9A, its cathode goes positive along with its control grid due to electron current flow from ground through the tube and in this condition the control grid of stage V9B follows the positive swing up to the bias value as determined by voltage divider R62 and R64. On the positive swing of the grid of tube V9B above the bias voltage determined by resistances R62 and R64, the grid of stage V9B draws current through its cathode and resistor R64 and presents a very low grid to cathode D.-C. impedance to the stray capacitance across diode CR6 when that diode is nonconducting. Considering electron current flow, at the start of the positive swing, the reference potential at the voltage divider point between resistances R62 and R64 and hence at the control grid of pentode V9B is higher than the voltage point potential at the cathode of triode V9A, hence crystal diode CR6 provides a very low impedance to the flow of electron current therethrough until the input signal rises to such a value that the potential at the cathode of stage V9A, the cathode follower, is larger, i.e., more positive, than the reference potential at the reference voltage divider point and thus crystal diode CR6 presents a very large impedance to further current flow through the diode. At the point where the voltage at the cathode of triode V9A is more positive than the reference voltage, the diode CR6 cuts off and also the voltage at the grid of amplifier V9B becomes more positive than the cathode.

This positive voltage on the grid of amplifier V9B produces very low impedance between the grid and cathode with the result that any current coupled through the stray capacity across diode CR6, when it is nonconducting, does not affect the output of amplifier V9B but flows to ground through the low grid to cathode impedance of tube V9B and capacitance C12 shunted by resistance R64.

Any charge developed on the stray capacity across diode CR6 may tend to maintain that diode nonconducting after the potential of the cathode follower V9A drops below the reference voltage between resistances R62 and R64. This is undesirable. To reduce this effect resistances R60, R64 and R11, and particularly R60, are made small so that the capacity discharges therethrough on the downward swing of the positive voltage on the cathode of tube V9A so that this capacity is discharged prior to the next upward swing of this voltage. Thus the time at which pentode V9B starts conducting is a function of the impressed signal and is independent of the stray capacitance of crystal diode CR6. Even on larger signals the output limiter amplitude remains at the level preset by the choice of the bleeder resistors R62 and R64 and the tube characteristics of pentode V9B. As stated, therefore, the crystal diode CR6 presents a low impedance as long as the signal voltage is below the positive reference voltage at the junction of resistors R62 and R64 but above the reference voltage, the crystal diode CR6 presents a high impedance and the signal does not pass as best shown in the right hand half of FIG. 2.

The bias above ground of pentode V9B is set by the bleeder R62 and R64 such that the cut-off of the pentode V9B falls in roughly the same location on the negative half of the signal that the diode cut-off fell on the positive half. In other words the characteristics of the pentode portion of a 6AU8 tube are such that for the particular illustrative embodiment voltage at the junction between R62 and R64 the cut-off at the negative portion will be the same as at the positive portion. It will be readily understood that if another pentode were utilized, the voltage at the junction of resistors R62 and R64 would be made accordingly different. In other words the signal swinging below the cut-off point of the tube is not passed. This gives a symmetrical clipped output as best shown in FIG. 3. FIG. 3 therefore represents the signal at the plate of pentode V9B. This signal at the plate of pentode V9B may be developed across a small resistance R12 in the plate circuit of pentode V9B. Coupling may be effected through capacitor C14 to a high gain post limiter amplifier (not shown). There are no tuned circuits in this limiter and hence the limiting of low frequency amplitude variations is good. As stated, the value of resistor R60 may be chosen so that it will discharge the stray capacitance of the diode CR6 before completion of the negative half of the cycle. Thus the time at which stage V9B starts conducting is a function of the impressed signal and is independent of the stray capacitance of diode CR6 since this stray capacitance has discharged between input signals. Even on larger signals, the output limiter amplitude remains at the level preset by the choice of bleeder resistors to form a definite potential at the junction between the bleeder resistors and by the characteristics of the pentode V9B, each of which may be chosen in accordance with the other.

It should be noted that on signals of relatively large amplitude being coupled from the last intermediate frequency amplifier stage into the cathode follower, on the positive swing the input will be faithfully reproduced on resistance R11 assuming as in the usual case that the tube has not gone into saturation. On the negative swing however, assuming a larger signal than that shown in FIG. 2, the negative excursion of that signal will be somewhat clipped when stage V9A goes into cut-off. Because resistor R11 presents a relatively low impedance as compared with the grid to cathode inter-electrode capacitance of stage V9A, the amount of voltage coupling between grid and cathode of that stage is relatively negligible. Thus, the voltage at the cathode output point of stage V9A follows the grid on the positive swing but on the negative swing cut-off will occur at the cut-off point of the tube. This establishes a maximum excursion point in a negative direction such that regardless of the amplitude of the input voltage, the negative excursion can not exceed a certain negative reference voltage. The diode clips on the positive going excursion so that no matter what amplitude of A.-C. potential is applied to the grid of the cathode follower, the potential at the grid of the pentode V9B can not exceed the reference positive excursion nor a negative excursion determined by the cut-off of the cathode follower V9A. Stage V9B further serves to cut-off the applied signal at its reference voltage as shown in FIG. 3. A significant feature of the invention lies in the fact that the maximum voltage applied to the grid of the pentode can never exceed the positive swing delivered by the diode nor the negative excursion from the cathode follower and hence any stray capacitance associated with the input to the output circuit of stage V9B would not pass a signal directly from the input to the output and hence the output of the limiter circuit will be truly limited for all values of input signals. To further explain this advantage of the circuit, by comparison, if the input signal from the last IF amplifier were directly connected to the grid of stage V9B as in prior art limiters, then when a certain amount of signal was exceeded the stray coupling between input and output would then allow the output to increase above the limiting level so that on very strong signals the output voltage would pass amplitude modulation and noise from the last IF stage thereby reducing the desirable qualities of the limiter circuit.

It is therefore demonstrated that a method of limiting and a limiter circuit suitable for receivers and especially adaptable to visual signals has been produced which will accommodate a wide range of input signals and still present a constant output and which will circumvent the disadvantages of prior art devices and make possible a superior type of limiter.

While particular embodiments of the invention have been shown and described, it should be understood that the invention is not limited thereto and it is intended in the appended claims to claim all such variations as fall in the true spirit of the present invention.

What is claimed is:

1. The combination, in a symmetrical limiter amplifier, of an electron discharge device having an anode, a cathode, and a control electrode, an output circuit between said cathode and anode, means to bias said cathode positive relative to a common point of reference potential, means to develop a variable unidirectional voltage positive relative to said point and varying bidirectionally in accord with signals to be amplified, a unilateral conducting device connected between said last recited means and said control electrode to supply said last voltage to said control electrode and poled to become nonconducting when said voltage exceeds said bias on said cathode whereby said control electrode becomes positive relative to said cathode when said unilateral conducting device becomes nonconducting, said discharge device having such low impedance between said control electrode and cathode when said control electrode is positive relative to said cathode that signal voltage coupled through any undesired stray capacity in shunt with said diode when the diode is nonconducting has a negligible effect upon said output circuit whereby current variations in said output circuit in response to positive going excursions of said signal variations are limited to a value determined by said bias notwithstanding such stray capacity.

2. The combination, in a symmetrical limiter amplifier, of an electron discharge device having an anode, a cathode, and a control electrode, an output circuit between said cathode and anode, means to bias said cathode positive relative to a common point of reference potential, means to develop a variable unidirectional voltage positive relative to said point and varying bidirectionally in accord with signals to be amplified, a unilateral conducting device connected between said last recited means and said control electrode to supply said last voltage to said control electrode and poled to become nonconducting when said voltage exceeds said bias on said cathode whereby said control electrode becomes positive relative to said cathode when said unilateral conducting device becomes nonconducting, said discharge device having such low impedance between said control electrode and cathode when said control electrode is positive relative to said cathode that signal voltage coupled through any undesired stray capacity in shunt with said unilateral conducting device when nonconducting has a negligible effect upon said output circuit whereby current variations in said output circuit in response to positive going excursions of said signal variations are limited to a value determined by said bias notwithstanding such stray capacity, and said discharge device having a cut off voltage such that current in said output circuit approaches zero on diminution in said signal voltage by an amount determined by said bias voltage whereby current in said output is limited on positive peaks by said diode and on negative peaks by said cut off voltage.

3. The combination, in a symmetrical limiter, of an electron discharge device having an anode, a cathode, and a control electrode, and output circuit between said cathode and anode, means to bias said cathode positive relative to a common point of reference potential, means to develop a variable unidirectional voltage positive relative to said point and varying bidirectionally in accord with signals to be amplified, a unilateral conducting device connected between said last recited means and said control electrode to supply said last voltage to said control electrode and poled to become nonconducting when said voltage exceeds said bias on said cathode whereby said control electrode becomes positive relative to said cathode when said unilateral conducting device becomes nonconducting, said discharge device having such low impedance between said control electrode and cathode when said control electrode is positive relative to said cathode that signal voltage coupled through any undesired stray capacity in shunt with said unilateral conducting device when nonconducting has a negligible effect upon said output circuit whereby current variations in said output circuit in response to positive going excursions of said signal variations are limited to a value determined by said bias notwithstanding such stray capacity, and a discharge path across said unilateral conducting device of sufficiently low resistance to discharge said stray capacity before the next positive going excursion of said signal voltage.

4. The combination, in a symmetrical limiter, of a cathode follower having an anode and a cathode, an amplifier having a control electrode, a cathode and anode, a resistance connected between the cathode of said cathode follower and a point of reference potential on which resistance a signal voltage is produced by signal current flowing between the anode and cathode of said cathode follower, means to bias the cathode of said amplifier positive relative to said point, a unilateral conducting device connected between the cathode of the cathode follower and the control electrode of said amplifier poled to become nonconducting when the cathode of the cathode follower becomes positive relative to the cathode of said amplifier whereby said control electrode is positive relative to said cathode of said amplifier when said unidirectional conducting device is nonconducting and voltage coupled to said control electrode by any undesired stray capacity across said unidirectional conducting device is substantially prevented from affecting the current in the anode of said amplifier.

5. The combination, in a symmetrical limiter, of a cathode follower having an anode and a cathode, an amplifier having a control electrode, a cathode and anode, a resistance connected between the cathode of said cathode follower and a point of reference potential on which resistance a signal voltage is produced by signal current flowing between the anode and cathode of said cathode follower, means to bias the cathode of said amplifier positive relative to said point, a unilateral conducting device connected between the cathode of the cathode follower and the control electrode of said amplifier poled to become nonconducting when the cathode of the cathode follower becomes positive relative to the cathode of said amplifier whereby said control electrode is positive relative to said cathode of said amplifier when said unidirectional conducting device is nonconducting and voltage coupled to said control electrode by any undesired stray capacity across said unidirectional conducting device is substantially prevented from affecting the current in the anode of said amplifier, said cathode follower and amplifier both being adapted to limit the negative excursions of the incoming signal exceeding predetermined magnitudes at which limiting is desired.

References Cited in the file of this patent

UNITED STATES PATENTS

| | | |
|---|---|---|
| 2,298,657 | Smith et al. | Oct. 13, 1942 |
| 2,324,275 | Becker | July 13, 1943 |
| 2,683,806 | Moody | July 13, 1954 |
| 2,785,303 | Keizer et al. | Mar. 12, 1957 |